United States Patent [19]

Takada

[11] 4,255,716
[45] Mar. 10, 1981

[54] AUTOMATIC GAIN CONTROL CIRCUIT
[75] Inventor: Shigeho Takada, Oita, Japan
[73] Assignee: Tokyo Shibaura Denki Kabushiki Kaisha, Kawasaki, Japan
[21] Appl. No.: 940,021
[22] Filed: Sep. 6, 1978
[30] Foreign Application Priority Data Sep. 10, 1977 [JP] Japan .................. 52/109136
Sep. 10, 1977 [JP] Japan .................. 52/109137

[51] Int. Cl.³ ............................................. H03G 3/30
[52] U.S. Cl. ................................................. 330/284
[58] Field of Search ............... 325/412, 413; 330/145, 330/278, 284, 70, 71, 74

[56] References Cited
U.S. PATENT DOCUMENTS 3,268,828  8/1966  Mollinga ............................... 330/284
3,286,189  11/1966  Mitchell et al. ................... 350/704 X

OTHER PUBLICATIONS

Hunter, *Handbook of Semiconductor Electronics*, copyright 1956, 1962, McGraw-Hill Book Company, Inc., pp. 17-16, 17-17.
Bilotti, "A Distributed MOS Attenuator", *Proceedings of the IEEE*, Apr. 1967, pp. 562, 563.
McIntosh–"Variable Resistance FET gives 75Db Gain Control"–Electronic Design, p. 56, Aug. 1963.

*Primary Examiner*—James B. Mullins
*Attorney, Agent, or Firm*—Oblon, Fisher, Spivak, McClelland & Maier

[57] ABSTRACT

An automatic gain control circuit which comprises a variable resistance element connected between the power source and a transistor element to amplify a signal. The resistance of the variable resistance element is controlled according to the output of the transistor element. The resistance of the variable resistance element is decreased in response to the increment in amplitude of the output of the transistor element, which decreases the amplitude of the output signal.

3 Claims, 8 Drawing Figures

AUTOMATIC GAIN CONTROL CIRCUIT

BACKGROUND OF THE INVENTION

1. Field of the Invention

This invention relates to an automatic gain control circuit which, even if the amplitude of an input signal applied thereto is increased to a value greater than a predetermined value, provides a constant output amplitude.

2. Description of the Prior Art

One example of a conventional automatic gain circuit is shown in FIG. 1. In this circuit, an input signal applied to a terminal 1 is applied through a DC stopping capacitor 2 to an amplifier constituted by an npn type transistor 3 and a load resistor 4, as a result of which the input signal is amplified by the amplifier. A DC input bias current to the amplifier is obtained from a DC source 5 and a resistor 6 and is varied by an npn type transistor 7, so that the amplitude of an output signal is maintained constant even if the amplitude of the input signal applied to the terminal 1 is changed. Then, the output signal provided at a terminal 8 connected to the collector of the transistor 3 is amplified, and thereafter rectified, and the resultant signal is applied, as a control signal (or an AGC signal), to the base of the transistor 7 through a terminal 9 connected thereto. If the amplitude of the output signal is increased as the amplitude of the input signal increases, the current flowing in the transistor 7 is increased; while if the amplitude of the input signal is decreased, the current flowing in the transistor 7 is decreased. Thus, as the base bias of the transistor is varied in response to the increment or decrement of the amplitude of the input signal, the above-described circuit can be operated as an automatic gain control circuit. However, the conventional automatic gain control circuit is still disadvantageous in that the distortion of the output signal is increased with the increase in voltage of the control signal applied to the terminal 9 (or the increase in amplitude of the input signal). The reason for this resides in that as the voltage of the control signal is increased, the collector potential of the transistor 7 is decreased, as a result of which the amplification operation of the transistor 3 is shifted from class A to class B, and class B to class C.

BRIEF SUMMARY OF THE INVENTION

It is therefore an object of the present invention to provide an automatic gain control circuit the output signal of which is small in distortion.

It is a further object of the present invention to provide an automatic gain control circuit in which a constant output amplitude is provided at all times even if the amplitude of an input signal applied becomes higher than a predetermined value.

According to the invention, an automatic gain control circuit comprises: (a) a first power source; (b) a second power source; (c) an input terminal; (d) an output terminal; (e) a transistor having its collector connected to the output terminal, its base connected to the input terminal and its emitter connected to the second power source; (f) a variable resistance element connected between the first power source and the output terminal, the resistance of the variable resistance element being controlled according to the output of the transistor.

BRIEF DESCRIPTION OF THE DRAWINGS

The invention is illustrated by way of example in the accompanying drawings which form part of this application and in which:

FIG. 1 is a circuit diagram showing a conventional automatic gain control circuit which has been referred to;

DETAILED DESCRIPTION OF THE INVENTION

Figure 1:
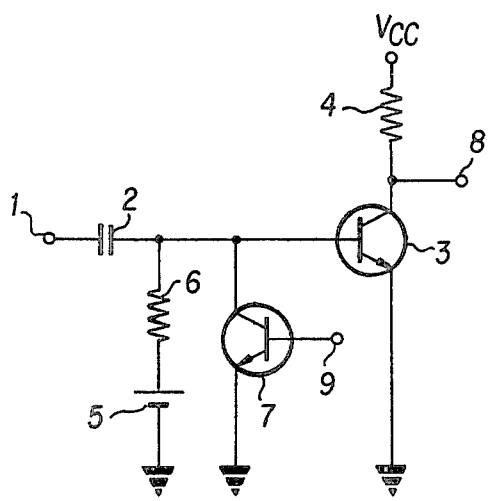
Figure 2:
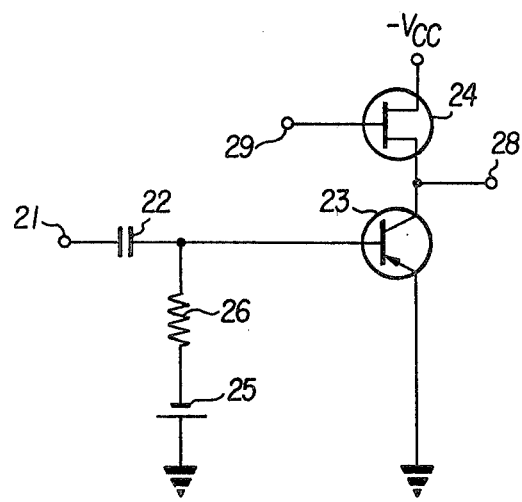
FIG. 2 is a circuit diagram showing an automatic gain control circuit which is a first embodiment of the present invention.

A first embodiment of this invention, or a first example of an automatic gain control circuit according to the invention as shown in FIG. 2, comprises an input terminal 21 to which an input signal is applied, the input signal being applied through a DC stopping capacitor 22 to the base of a transistor 23 of pnp type; and an n-channel vertical junction field-effect transistor 24 connected between the collector of the transistor 23 and a supply voltage source $-V_{cc}$. That is, the transistor 23 forms an amplifier employing the field-effect transistor 24 as a load resistance. The emitter of the transistor 23 is grounded. A series circuit of a DC source 25 and a resistor 26 for supplying a DC bias is connected to the base of the transistor 23. The other terminal of the DC source is grounded. The connection point of the transistor 23 and the n-channel vertical junction field-effect transistor 24 is connected to an output terminal 28. An output signal provided at the output terminal 28 is amplified and rectified, and the output signal thus treated is applied to a terminal 29 connected to the gate of the n-channel vertical junction field-effect transistor 24. In other words, the terminal 29 is a control terminal to which a control signal for varying the resistance of the field-effect transistor 24 is applied. The voltage of the control signal applied to the terminal 29 is increased in positive polarity as the amplitude of the output signal provided at the output terminal 28 is increased, while it is increased in negative polarity as the amplitude of the output signal is decreased.

Figure 3:
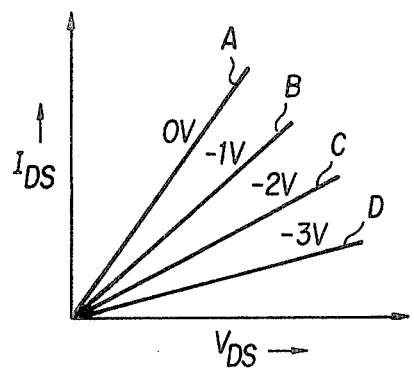
FIG. 3 is a graphical representation indicating the electrical characteristics of an n-channel type field-effect transistor used in the circuit shown in FIG. 2.

One example of the electrical characteristics of the n-channel vertical junction field-effect transistor 24 is shown in FIG. 3, in which the horizontal axis represents a drain-source voltage $V_{DS}$, and the vertical axis represents a drain-source current $I_{DS}$. More specifically, FIG. 3 indicates characteristic curves A, B, C and D obtained respectively when the gate voltage $V_{GS}$ is 0 V, $-1$ V, $-2$ V and $-3$ V. As is clear from the characteristic curves in FIG. 3, the n-channel vertical junction field-effect transistor 24 can be used as a variable resistance element with the gate voltage $V_{GS}$ varied.

Figure 4:
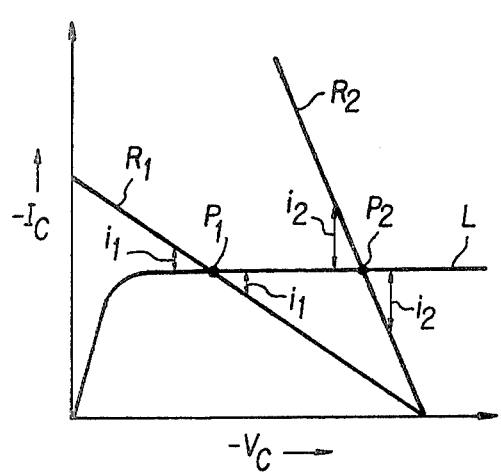
FIG. 4 is a graphical representation indicating the electrical characteristics of the automatic gain control circuit shown in FIG. 2.

The operation of the circuit thus organized will be described. First, an input signal having a suitable amplitude is applied to the terminal 21, and a control signal having a voltage is applied to the terminal 29. If it is assumed that the resistance of the field-effect transistor 24 serving as the variable resistance element is represented by $r_1$, then the characteristics of the transistor 23 are as indicated in FIG. 4 in which the horizontal axis represents a collector voltage ($-Vc$) while the vertical axis represents a collector current ($-Ic$) and the operating point is at a position $P_1$. In FIG. 4, the straight line $R_1$ is a load line obtained according to the resistance $r_1$ of the field-effect transistor 24, and the curve L is the characteristic curve of the transistor 23 obtained according to the aforementioned input signal. If there is a base input current changing by a value $i_1$ respectively above and below the operating point $P_1$, the amplitude $V_1$ of the output signal at the terminal 28 can be represented by the following expression:

$$i_1 \cdot hfe \cdot r_1$$

where hfe is the current amplification factor of the transistor 23 with the emitter grounded.

Now consider the case where the amplitude of the input signal is increased. In this case, the amplitude of the output signal provided at the terminal 28 is also increased. As the amplitude of the output signal is increased, the voltage of the control signal applied to the terminal 29 is increased in positive polarity. In this operation, as is apparent from the characteristic curves of the n-channel vertical junction field-effect transistor 24 shown in FIG. 3, the resistance of the field-effect transistor 24 serving as the variable resistance element is decreased as the gate voltage $V_{GS}$ becomes more positive. If this resistance is represented by $r_2$ ($r_2 < r_1$), then the load line becomes as indicated by $R_2$, and the operating point is moved to a position $P_2$. And if there are two base input currents each having a value $i_2$ ($i_2 > i_1$) above and below the operating point $P_2$, the amplitude $v_2$ of the output signal at the output terminal 28 can be expressed by ($i_2 \cdot hfe \cdot r_2$). If the resistance variation range of the n-channel vertical junction field-effect transistor 24 is sufficiently wide and the amplification factor of the circuit from the terminal 28 to the terminal 29 is sufficiently high, then $v_1 \infty v_2$; that is, the amplitude of the output signal before the input signal amplitude is increased is substantially equal to the amplitude of the output signal after it has been increased. While the operating point of the transistor 23 is moved from $P_1$ to $P_2$, the DC bias current of the transistor 23 is scarcely changed. Therefore, the generation of distortion in the output signal can be prevented. Furthermore, if the operating point with the minimum amplitude of the input signal is suitably selected, then even when the input signal amplitude increases so as to be out of the control range, the output signal amplitude is merely increased and the abrupt increment of the output signal amplitude associated with the conventional circuit can be prevented. If it is impossible to make the control with a single automatic gain control circuit, the control can be achieved by cascade-connecting a number of automatic gain control circuits.

Figure 5:
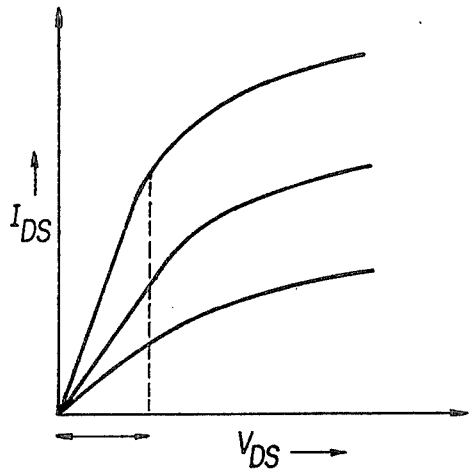
FIG. 5 is also a graphical representation indicating the electrical characteristics of a lateral junction type field-effect transistor.

In the above-described embodiment, the n-channel vertical junction field-effect transistor is employed; however, it should be noted that it may be replaced by an n-channel lateral junction field-effect transistor having electrical characteristics as indicated in FIG. 5. However, in this case, it is necessary to operate it in the range of low drain-source voltage $V_{DS}$.

Figure 6:
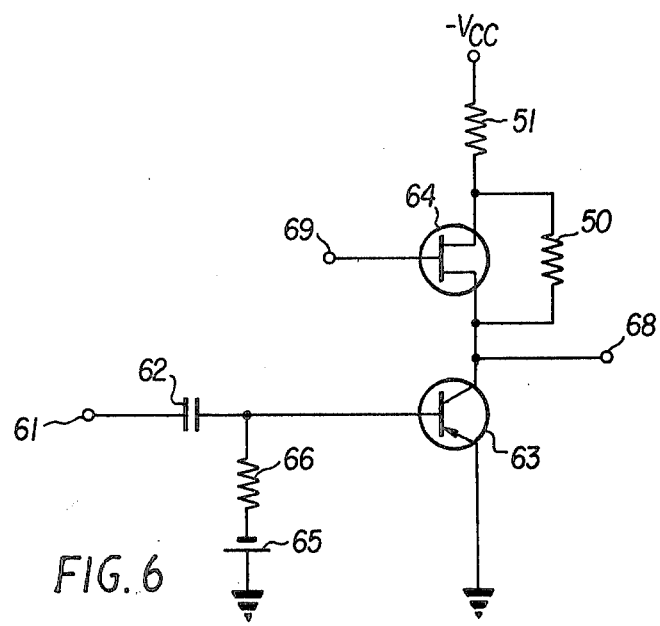
FIGS. 6 and 7 are circuit diagrams illustrating other embodiments of the invention.

FIG. 6 shows a second example of the automatic gain control circuit according to this invention. An n-channel vertical junction field-effect transistor 64 is shunted by a resistor 50. A resistor 51 is connected in series to the field-effect transistor 64. With the automatic gain control circuit, the resistance variation range of the field-effect transistor 64 can be controlled.

Figure 7:
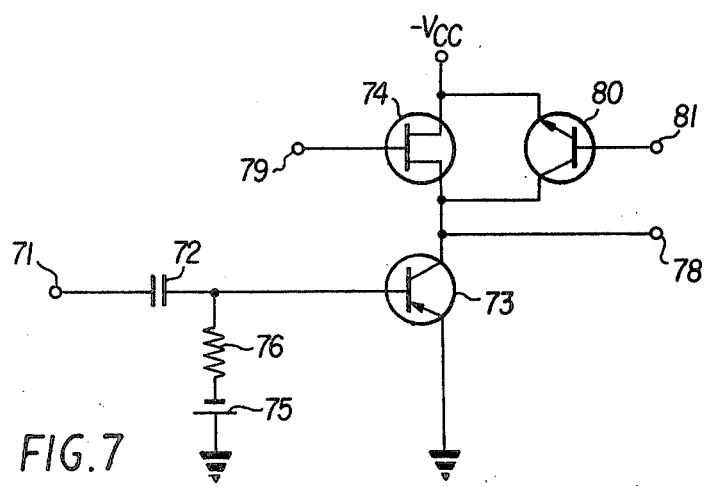

A third example of the automatic gain control circuit according to the invention is shown in FIG. 7. An n-channel vertical junction field-effect transistor 74 is connected between the collector of a transistor 73 and a supply voltage source $-Vcc$, and it is shunted by an npn-type transistor 80. Thus, the transistor 73 forms an amplifier employing the field-effect transistor 74 as its resistance load. The collector current of the transistor 73 is controlled by the transistor 80 also. The common connection point of the transistor 73, the field-effect transistor 74 and the transistor 80 is connected to an output terminal 78. After being amplified and rectified, an output terminal provided at the output terminal is applied to a terminal 79 connected to the gate of the field-effect transistor 74 and to a terminal 81 connected to the base of the transistor 80. That is, the terminal 79 is a control terminal to which a first control signal for varying the resistance of the n-channel vertical junction field-effect transistor 74 is applied. The voltage of the first control signal applied to the terminal 79 is increased in positive polarity as the amplitude of the output signal provided at the terminal 78 is increased, while it is increased in negative polarity as the amplitude of the output signal is decreased. The terminal 81 is also a control terminal to which a second control signal for controlling the conductive state of the transistor 80 is applied. The voltage of the second control signal applied to the terminal 81 is increased in positive polarity as the amplitude of the output signal provided at the terminal 78 is decreased. The voltage of the second control signal is obtained by subjecting the output voltage at the terminal 78 to amplifying, damping or level-shifting. The second control signal is fed back to the terminal 81.

Figure 8:
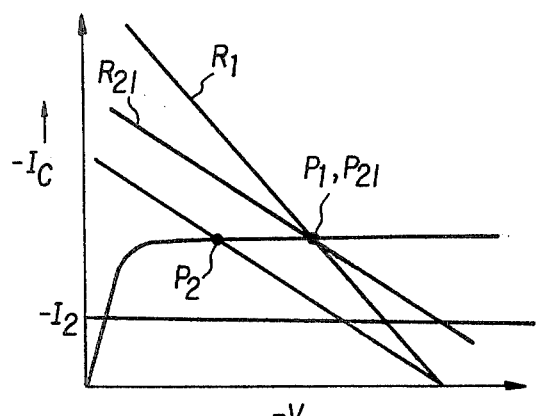
FIG. 8 is a diagram indicating the electrical characteristics of the automatic gain control circuit shown in FIG. 7.

The operation of the automatic gain control circuit thus organized will be described. First, an input signal having a suitable amplitude is applied to the terminal 71, and in this case the first control signal having a voltage is applied to the terminal 79. It is assumed that the voltage of the second control signal is zero. If the resistance of the n-channel vertical junction field-effect transistor 74 is $r_1$, the characteristics of the transistor 73 are as indicated in FIG. 8 in which the horizontal axis represents a collector voltage ($-Vc$) of the transistor 73 while the vertical axis represents a collector current ($-Ic$) thereof, and the operating point is at a position $P_1$. In the graphical representation in FIG. 8, the straight line $R_1$ is a load line obtained according to the resistance $r_1$ of the field-effect transistor 74, and the curve L is a characteristic curve of the transistor 73 obtained according to the aforementioned input signal. If there is a base input current changing by a value $i_1$ respectively above and below the operating point $P_1$, the amplitude $v_1$ of the output signal at the terminal 78 can be represented by the following expression:

$$i_1 \cdot hfe \cdot r_1$$

where hfe is the current amplification factor of the transistor 73 with the emitter grounded.

Now consider the case where the amplitude of the input signal is decreased. In this case, the amplitude of the output signal at the terminal 78 is also decreased. As the amplitude of the output signal is decreased, the voltage of the first control signal applied to the terminal 79 is increased in negative polarity, while the voltage of the second control signal applied to the terminal 81 is increased in positive polarity. Then, as is apparent from the characteristics of the n-channel vertical junction field-effect transistor shown in FIG. 3, the resistance of the field-effect transistor 24 serving as the variable resistance element is increased as the gate voltage $V_{GS}$ becomes more negative. If in this case this resistance is represented by $r_2(r_2 > r_1)$ and the current flowing in the transistor 80 is disregarded, then the load line is as indicated by $R_2$ in FIG. 8 and the operating point is shifted to a position $P_2$. If there is a base input current changing by a value $i_2(i_2 < i_1)$ respectively above and below the operating point, the amplitude $v_2$ of the output signal at the terminal 78 can be expressed by $(i_2 \cdot hfe \cdot r_2)$. If the resistance variation range of the n-channel vertical junction field-effect transistor 74 is sufficiently wide, and the amplification factor of the circuit from the terminal 78 to the terminal 79 is sufficiently high, then $v_1 \leq v_2$; that is, the amplitude of the output signal before the input signal amplitude is decreased is substantially equal to the amplitude of the output signal after it has been decreased.

The operation of the automatic gain control circuit will be described by taking the current in the transistor 80 into account. As the amplitude of the input signal is decreased, the voltage of the second control signal is increased in positive polarity, whereupon the transistor 80 which has been maintained non-conductive is rendered conductive according to the voltage of the second control signal. As a result of this, a current path including the transistor 73, the transistor 80 and the supply voltage source $-Vcc$ is established. If the current flowing in this current path is represented by $(-I_2)$ assuming that the direction from the supply voltage source toward the ground is a positive direction, the load line $R_2$ assumes a position indicated by $R_{21}$ in FIG. 8, where it is shifted above by the value $|I_2|$. Accordingly, the position of the intersection of the load line $R_{21}$ and the characteristic curve L of the transistor 73, that is, the position of the operating point $P_{21}$ is the same as the position of the operating point $P_1$ obtained before the amplitude of the input signal is decreased.

After the amplitude of the input signal is increased, the voltage of the first control signal is increased in the positive direction while the voltage of the second control signal is decreased. Accordingly, it can be readily achieved to directly incorporate the above-described automatic gain control circuit in an amplifier without using a DC stopping capacitor. If the control cannot be achieved by a single state automatic gain control circuit, the control can be achieved by using a number of automatic gain control circuits cascade-connected.

The automatic gain control circuit according to the invention can be effectively applied to not only a high frequency amplifier but also an audio amplifier. For instance, it can be applied to the input section of a microphone, and the recording level automatic control section of a tape recorder.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An automatic gain control circuit comprising:
   (a) an input terminal;
   (b) an output terminal;
   (c) a first transistor element having a collector electrode, a base electrode and an emitter electrode, the collector electrode of the transistor element being connected to the output terminal, and the base electrode of the transistor element being connected to the input terminal;
   (d) means for connecting the emitter electrode of the transistor element to one of a pair of opposite polarity terminals of an external power source;
   (e) a variable resistance element;
   (f) means for connecting the variable resistance element between the collector electrode of the first transistor element and the other of the pair of opposite polarity terminals of the external power source; and
   (g) a second transistor element connected in parallel to the variable resistance element, for controlling the collector current of the first transistor element, the variable resistance element and the second transistor element being controlled according to the output of the first transistor element.

2. An automatic gain control circuit as claimed in claim 1, wherein: the variable resistance element is a junction type field-effect transistor.

3. An automatic gain control circuit comprising:
   (a) an input terminal;
   (b) an output terminal;
   (c) a transistor element having a collector electrode, a base electrode and an emitter electrode, the collector electrode of the transistor element being connected to the output terminal, and the base electrode of the transistor element being connected to the input terminal;
   (d) means for connecting the emitter electrode of the transistor element to one of a pair of opposite polarity terminals of an external power source;
   (e) a variable resistance element; and
   (f) means for connecting the variable resistance element between the collector electrode of the transistor element and the other of the pair of opposite polarity terminals of the external power source;
   (g) the resistance of the variable resistance element being controlled according to the output of the transistor element with linear characteristics, where said variable resistance element is a junction type field-effect transistor.

* * * * *